United States Patent
Zhao et al.

(10) Patent No.: US 11,264,242 B2
(45) Date of Patent: Mar. 1, 2022

(54) METHOD AND APPARATUS FOR DETERMINING EXPANSION COMPENSATION IN PHOTOETCHING PROCESS, AND METHOD FOR MANUFACTURING DEVICE

(71) Applicant: Wuhan Xinxin Semiconductor Manufacturing Co., Ltd., Hubei (CN)

(72) Inventors: Changlin Zhao, Hubei (CN); Sheng Hu, Hubei (CN); Yunpeng Zhou, Hubei (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 169 days.

(21) Appl. No.: 16/582,549

(22) Filed: Sep. 25, 2019

(65) Prior Publication Data

US 2021/0035805 A1 Feb. 4, 2021

(30) Foreign Application Priority Data

Aug. 2, 2019 (CN) .......................... 201910713739.X

(51) Int. Cl.
*H01L 21/20* (2006.01)
*H01L 21/02* (2006.01)
*H01L 21/68* (2006.01)

(52) U.S. Cl.
CPC .... *H01L 21/2007* (2013.01); *H01L 21/02019* (2013.01); *H01L 21/68* (2013.01)

(58) Field of Classification Search
CPC ....... H01L 2224/94; H01L 2223/54426; H01L 23/544; H01L 25/0657; H01L 21/8221
See application file for complete search history.

(56) References Cited

U.S. PATENT DOCUMENTS 5,427,973 A  6/1995 Satoh et al.
5,478,782 A  12/1995 Satoh et al.
(Continued)

FOREIGN PATENT DOCUMENTS

CN  1396653 A  2/2003
CN  102109700 A  6/2011
(Continued)

OTHER PUBLICATIONS

First Chinese Office Action regarding Application No. 201910713739.X dated Jan. 13, 2021. English translation provided by Unitalen Attorneys at Law.

*Primary Examiner* — Jaehwan Oh
(74) *Attorney, Agent, or Firm* — Harness, Dickey & Pierce, P.L.C.

(57) ABSTRACT

A method and an apparatus for determining expansion compensation in a photoetching process, and a method for manufacturing a semiconductor device are provided. A relative vector misalignment value of a first wafer and a second wafer after being bonded is obtained based on a relative position relationship between a first alignment pattern of the first wafer and a second alignment pattern of the second wafer in a boding structure. A relative expansion value of the first wafer and the second wafer is obtained based on the relative vector misalignment value. A developing expansion compensation value in the photoetching process is obtained. The expansion compensation value is used to the photoetching process of a first conductor layer including the first alignment pattern of the first wafer and/or a second conductor layer including the second alignment pattern of the second wafer.

10 Claims, 4 Drawing Sheets

(56) References Cited

U.S. PATENT DOCUMENTS

| | | | |
|---|---|---|---|
| 5,493,137 A | 2/1996 | Satoh et al. | |
| 5,523,254 A | 6/1996 | Satoh et al. | |
| 7,193,328 B2 | 3/2007 | Suzuki et al. | |
| 8,378,715 B2 * | 2/2013 | Or-Bach | H01L 25/18 326/101 |
| 8,900,885 B1 * | 12/2014 | Hubbard | H01L 22/12 438/5 |
| 2003/0006509 A1 | 1/2003 | Suzuki et al. | |
| 2011/0147969 A1 | 6/2011 | Song | |
| 2013/0020707 A1 * | 1/2013 | Or-Bach | H01L 29/7881 257/741 |
| 2017/0213821 A1 * | 7/2017 | Or-Bach | H01L 21/76254 |
| 2019/0043826 A1 * | 2/2019 | Sugaya | H01L 23/544 |
| 2019/0164834 A1 * | 5/2019 | Or-Bach | H01L 21/6835 |
| 2019/0279965 A1 * | 9/2019 | Lattard | H01L 25/0657 |
| 2019/0355698 A1 * | 11/2019 | Guo | H01L 25/0657 |
| 2019/0355699 A1 * | 11/2019 | Guo | H01L 25/0657 |
| 2020/0091015 A1 * | 3/2020 | Sugaya | H01L 21/68735 |
| 2020/0209164 A1 * | 7/2020 | Ueyama | H01L 21/68 |
| 2020/0273836 A1 * | 8/2020 | Sugaya | H01L 22/20 |
| 2020/0286851 A1 * | 9/2020 | Mitsuishi | H01L 21/68 |

FOREIGN PATENT DOCUMENTS

| | | |
|---|---|---|
| CN | 103727884 A | 4/2014 |
| CN | 106340485 A | 1/2017 |
| CN | 109920751 A | 6/2019 |
| JP | H0621406 A | 1/1994 |

* cited by examiner

METHOD AND APPARATUS FOR DETERMINING EXPANSION COMPENSATION IN PHOTOETCHING PROCESS, AND METHOD FOR MANUFACTURING DEVICE

CROSS REFERENCE TO RELATED APPLICATION

The present application claims the priority to Chinese Patent Application No. 201910713739.X, titled "METHOD AND APPARATUS FOR DETERMINING EXPANSION COMPENSATION IN PHOTOETCHING PROCESS, AND METHOD FOR MANUFACTURING DEVICE", filed on Aug. 2, 2019 with the Chinese Patent Office, which is incorporated herein by reference in its entirety.

FIELD

The present disclosure relates to the field of a semiconductor device and manufacturing thereof, and in particular to a method and apparatus for determining expansion compensation in a photoetching process, and a method for manufacturing a semiconductor device.

BACKGROUND

With continuous development of the semiconductor technology, the technology of Three-Dimensional Integrated Circuit (3D-IC) is widely used. In the 3D-IC technology, different wafers are stacked and bonded together by utilizing the wafer level packaging technology. The 3D-IC technology has advantages of a high performance, a low cost and a high level of integration. If an alignment offset occurs during a process of wafer bonding, a connection offset of the bonded device may occur, resulting in bad influence on yield and performance of products.

SUMMARY

In view of the above, the present disclosure aims to provide a method and an apparatus for determining expansion compensation in a photoetching process and a method for manufacturing a semiconductor device, to decrease a misalignment during a process of wafer bonding and improve yield and performance of products.

Technical solutions according to embodiments of the present disclosure are described as follows.

A method for determining expansion compensation in a photoetching process is provided. Expansion compensation on the photoetching process is performed based on a bonding structure. The bonding structure includes a first wafer and a second wafer to be bonded. The first wafer is provided with a first conductor layer including a first wiring layer and a first alignment pattern. The second wafer is provided with a second conductor layer including a second wiring layer and a second alignment pattern. The bonding structure is obtained by aligning the first wafer with the second wafer through the first alignment pattern and the second alignment pattern, and bonding the first wafer to the second wafer. The method includes:

obtaining a relative vector misalignment value of the first wafer and the second wafer based on a relative position relationship between the first alignment pattern and the second alignment pattern in the bonding structure;

obtaining a relative expansion value of the first wafer and the second wafer based on the relative vector misalignment value; and determining a developing expansion compensation value in the photoetching process based on the relative expansion value, where the expansion compensation value is used to the photoetching process of the first conductor layer of the first wafer and/or the second conductor layer of the second wafer, and is used to reversely compensate a misalignment of the first wafer and the second wafer after being bonded.

In an embodiment, the process of obtaining a relative vector misalignment value of the first wafer and the second wafer based on a relative position relationship between the first alignment pattern and the second alignment pattern in the bonding structure includes:

obtaining a picture of the bonding structure, where the picture includes the first alignment pattern and the second alignment pattern;

determining central points of the first alignment pattern and the second alignment pattern in the picture; and obtaining the relative vector misalignment value of the first wafer and the second wafer based on the central points, where the relative vector misalignment value indicates a vector misalignment value of one of the first and second wafers relative to another of the first and second wafers.

In an embodiment, the first alignment pattern and the second alignment pattern are matched in a direction perpendicular to the bonding structure, to form a nested pattern.

In an embodiment, the first conductor layer is a top metal layer, and a first bonding layer made of a dielectric material is provided to cover the first conductor layer; or the first conductor layer is a bonding hole, and a first bonding layer made of a dielectric material is provided to cover the first conductor layer, where the bonding hole is arranged in the first bonding layer.

In an embodiment, the second conductor layer is a top metal layer, and a second bonding layer made of a dielectric material is provided to cover the second conductor layer; or the second conductor layer is a bonding hole, and a second bonding layer made of a dielectric material is provided to cover the second conductor layer, where the bonding hole is arranged in the second bonding layer.

An apparatus for determining expansion compensation in a photoetching process is provided. Expansion compensation on the photoetching process is performed based on a bonding structure. The bonding structure includes a first wafer and a second wafer to be bonded. The first wafer is provided with a first conductor layer including a first wiring layer and a first alignment pattern. The second wafer is provided with a second conductor layer including a second wiring layer and a second alignment pattern. The bonding structure is obtained by aligning the first wafer with the second wafer through the first alignment pattern and the second alignment pattern, and bonding the first wafer to the second wafer. The apparatus includes: a relative vector misalignment value obtaining unit, a relative expansion value obtaining unit and an expansion compensation value obtaining unit. The relative vector misalignment value obtaining unit is configured to obtain a relative vector misalignment value of the first wafer and the second wafer based on a relative position relationship between the first alignment pattern and the second alignment pattern in the bonding structure. The relative expansion value obtaining unit is configured to obtain a relative expansion value of the first wafer and the second wafer based on the relative vector misalignment value. The compensation value obtaining unit is configured to determine a developing expansion compensation value in the photoetching process based on the relative expansion value, where the expansion compensation value is used to the photoetching process of the first conductor layer of the first wafer and/or the second conductor layer of the second wafer, and is used to reversely compensate a misalignment of the first wafer and the second wafer after being bonded.

In an embodiment, the relative vector misalignment value obtaining unit includes: a picture obtaining unit, a central point determining unit and a vector misalignment value determining unit. The picture obtaining unit is configured to obtain a picture of the bonding structure, where the picture includes the first alignment pattern and the second alignment pattern. The central point determination unit is configured to determine central points of the first alignment pattern and the second alignment pattern in the picture. The vector misalignment value determination unit is configured to obtain the relative vector misalignment value of the first wafer and the second wafer based on the central points, where the relative vector misalignment value indicates a vector misalignment value of one of the first and second wafers relative to another of the first and second wafers.

In an embodiment, the first alignment pattern and the second alignment pattern are matched in a direction perpendicular to the bonding structure, to form a nested pattern.

A method for manufacturing a semiconductor device is provided. The method is applied to form a wafer to be bonded and includes:

providing a wafer, where the wafer is provided with a covering layer, and a device structure is arranged in the covering layer; and forming a conductor layer on the wafer, where the conductor layer includes a wiring layer and an alignment pattern, where a developing expansion compensation is performed in the photoetching process to form the conductor layer, and an compensation value for the expansion compensation is determined according to the method for determining expansion compensation in the photoetching process described above.

A method for manufacturing a semiconductor device is provided. The method includes:

providing a first wafer and a second wafer to be bonded, where the first wafer is provided with a first conductor layer including a first wiring layer and a first alignment pattern; the second wafer is provided with a second conductor layer including a second wiring layer and a second alignment pattern, where the first wafer and/or the second wafer is manufactured according to the method for manufacturing a semiconductor device described above; and aligning the first wafer with the second wafer through the first alignment pattern and the second alignment pattern, and bonding the first wafer to the second wafer.

According to the method and apparatus for determining expansion compensation in a photoetching process and the method for manufacturing a semiconductor device provided by embodiments of the present disclosure, a relative vector misalignment value of the first wafer and the second wafer after being bonded is obtained based on a relative position relationship between a first alignment pattern of a first wafer and a second alignment pattern of a second wafer in a bonding structure. A relative expansion value of the first wafer and the second wafer is obtained based on the relative vector misalignment value. A developing expansion compensation value in the photoetching process is obtained. The expansion compensation value is used to the photoetching process of a first conductor layer including the first alignment pattern of the first wafer and/or a second conductor layer including the second alignment pattern of the second wafer. In this way, by performing the expansion compensation for the photo-etching process, a misalignment of the two wafers caused by bonding is offset. Therefore, a misalignment of the wafers generated during bonding is reduced, thereby improving yield and performance of products.

BRIEF DESCRIPTION OF THE DRAWINGS

In order to illustrate the technical solutions according to embodiments of the present disclosure or the conventional technology clearer, the drawings to be used in embodiments of the present disclosure or the conventional technology are introduced simply hereinafter. Apparently, the drawings in the following descriptions show only some embodiments of the present disclosure, and other drawings may be obtained by those skilled in the art based on the provided drawings without any creative efforts.

DETAILED DESCRIPTION

Figure 1:
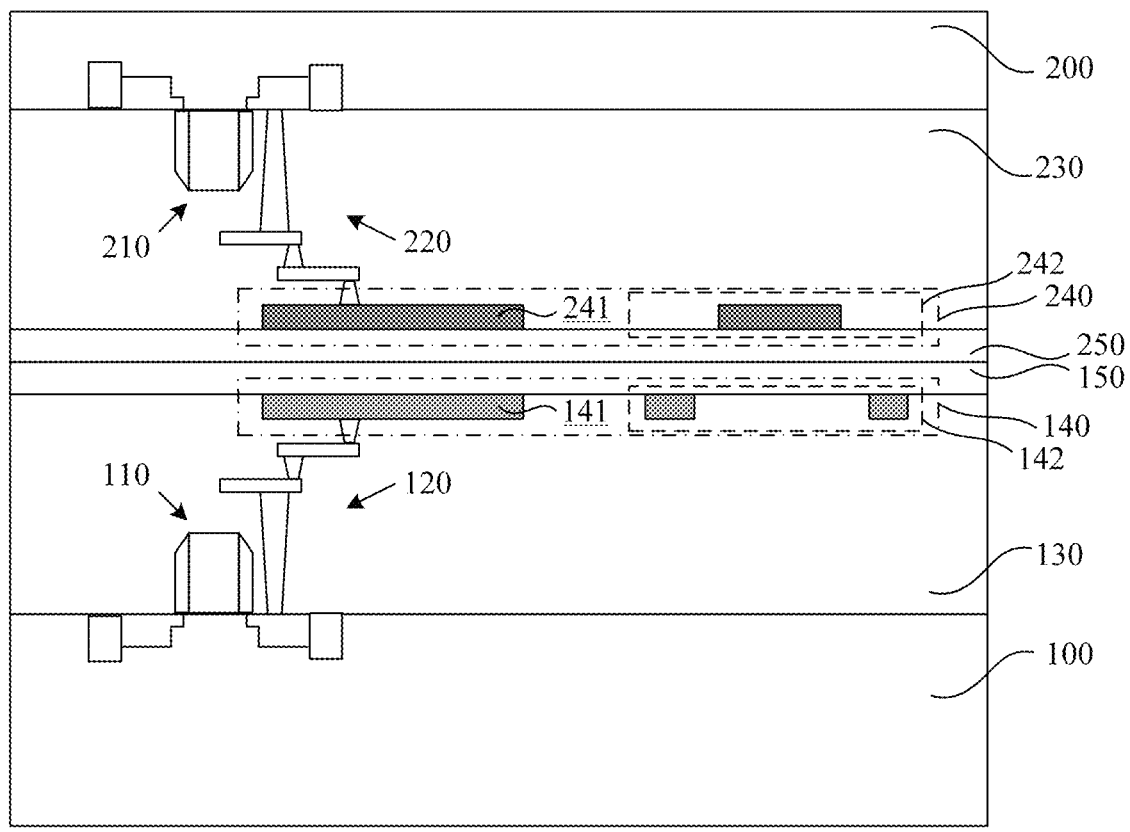
FIG. 1 is a schematic sectional diagram of a bonding structure for a method for determining expansion compensation in a photoetching process according to an embodiment of the present disclosure.

In order to make those skilled in the art clearly understand the above objective, features and advantages of the present disclosure, the embodiments of the present disclosure are described in detail below in conjunction with the drawings.

The embodiments of the present disclosure are described in detail hereinafter for fully understanding the present disclosure. However, the present disclosure may be implemented in other ways. For those skilled in the art, modification can be made to the specific embodiments without departing from the connotation of the present disclosure, the embodiments should not be understood to limit the present disclosure.

The present disclosure is described in conjunction with the drawings. For illustration, a cross-sectional view illustrating a structure of a device is not partially enlarged in a general scale in embodiments of the present disclosure. The drawings are merely for illustration, which should not be understood to limit the present disclosure. Additionally, three-dimensional sizes including a length, a width and a depth of a device should be included in an actual fabrication.

As described in the background, if a misalignment offset occurs during a process of wafer bonding, a connection offset of the bonded device may occur, resulting in bad influence on the yield and performance of products. It is found by the inventors that, a misalignment during bonding is caused by various factors, one of which is the bonding process itself. During the process of bonding, a bonding device is applied to apply pressure on an upper wafer or a lower wafer. Due to the pressure, the upper wafer and the lower wafer are bonded together from the center of the wafer to the edge of the wafer under molecular forces of a bonding material. However, deformations of the upper wafer and the lower wafer are different due to the pressure, thus a misalignment of the upper wafer and the lower wafer occurs during bonding, and thus a bonding offset is generated.

In view of the above, a method and an apparatus for determining expansion compensation in a phototching process and a method for manufacturing a semiconductor device are provided according to the present disclosure. A relative vector misalignment value of a first wafer and a second wafer after being bonded is obtained based on a relative position relationship between a first alignment pattern of the first wafer and a second alignment pattern of the second wafer in a boding structure. A relative expansion value of the first wafer and the second wafer is obtained based on the relative vector misalignment value. A developing expansion compensation value in the process of photoetching is obtained. The expansion compensation value is used to the photoetching process of a first conductor layer including the first alignment pattern of the first wafer and/or a second conductor layer including the second alignment pattern of the second wafer. By performing expansion compensation for the photoetching process, a misalignment of the two wafers caused by bonding is eliminated. Therefore, an offset of wafers during bonding is reduced, thereby improving yield and performance of products.

Figure 2:
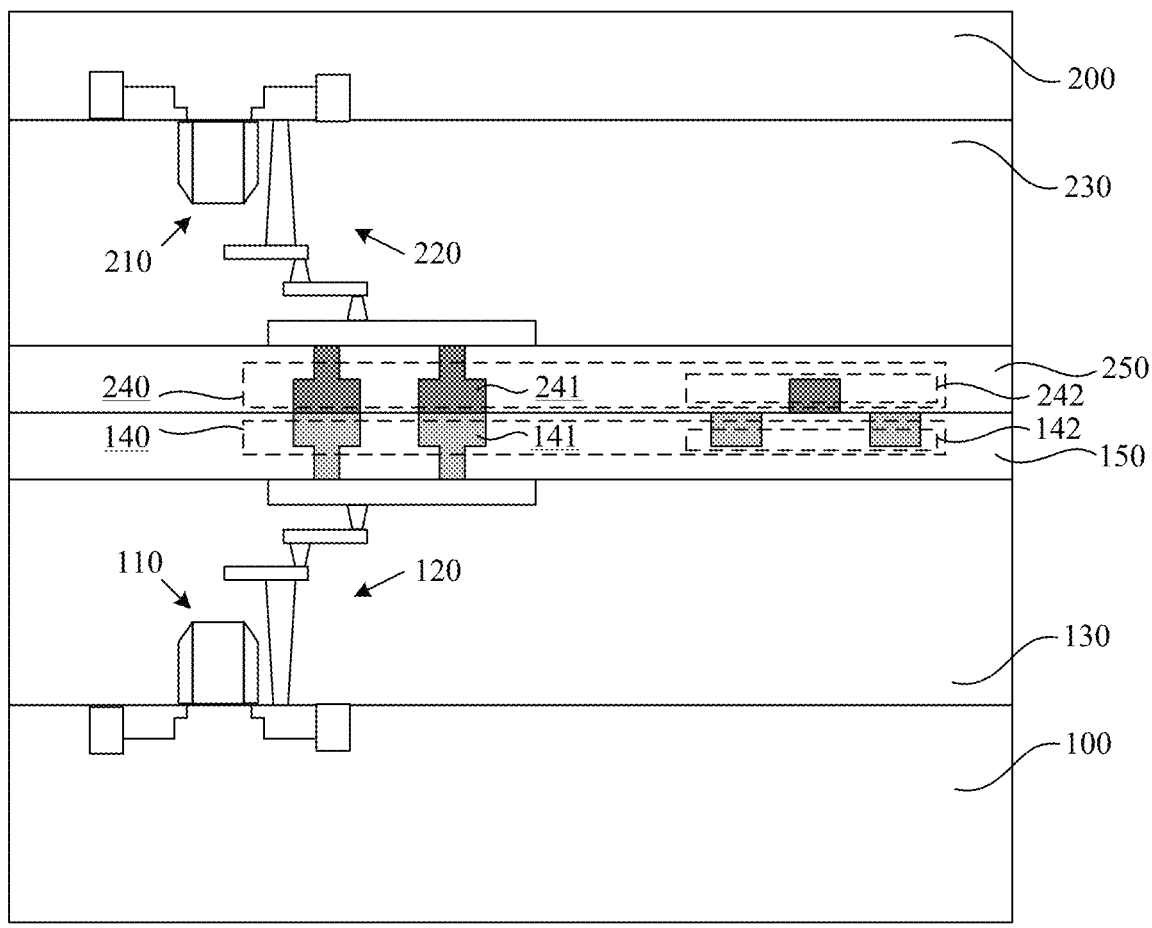
FIG. 2 is a schematic sectional diagram of a bonding structure for a method for determining expansion compensation in a photoetching process according to an embodiment of the present disclosure.

The method for determining expansion compensation in a photoetching process provided by the present disclosure is performed based on a bonding structure. Referring to FIG. 1 and FIG. 2, the bonding structure includes a first wafer 100 and a second wafer 200 that are bonded together. The first wafer 100 is provided with a first conductor layer 140 including a first wiring layer 141 and a first alignment pattern 142. The second wafer 200 is provided with a second conductor layer 240 including a second wiring layer 241 and a second alignment pattern 242. The bonding structure is obtained by aligning the first wafer 100 with the second wafer 200 through the first alignment pattern 142 and the second alignment pattern 242 and bonding the first wafer 100 to the second wafer 200.

The first wafer 100 and the second wafer 200 are manufactured through a series of processes. The bonding structure is formed after bonding the first wafer 100 to the second wafer 200 through a bonding process. In some embodiments, the first wafer 100 and the second wafer 200 may be a semiconductor substrate, for example, a Si substrate, a Ge substrate, a SiGe substrate, a Silicon On Insulator (SOI) substrate, and a Germanium On Insulator (GOI) substrate. In some other embodiments, the first wafer 100 and the second wafer 200 may be a semiconductor substrate including other element or compound such as GaAs, InP, and SiC; may have a stack structure such as Si/SiGe, or may have some other structure such as Silicon Germanium On Insulator (SGOI).

Both the first wafer 100 and the second wafer 200 are provided with a device structure and an interconnect structure configured to electrically connect with the device structure. The device structure is formed on the substrate. In the embodiment of the present disclosure, the device structure may be a MOS device, a sensor device, a memory device and/or a passive device. The memory device may include a non-volatile memory or a random memory, etc. The non-volatile memory may include a floating gate field effect transistor such as a NOR flash memory and a NAND flash memory, a ferroelectric memory, or a phase change memory, etc. The device structure may be a plane device or a stereoscopic device. The stereoscopic device may be a Fin-type Field Effect Transistor (FIN-FET), or a three-dimensional memory, etc. The sensor device may be a photosensitive device, etc. The passive device may be a resistor, or a capacitor, etc. The device structure may be covered by a dielectric material. The dielectric material may have a stack structure including an interlayer dielectric layer, an intermetallic dielectric layer or the like. The interconnect structure is formed in the dielectric material. The interconnect structure may include a contact plug, a via hole and a wiring layer. The wiring layer may include one layer or multiple layers. The interconnect structure may be made of a metal material, such as tugnsten, aluminum, or copper. The substrate may be a semiconductor substrate, for example, a Si substrate, a Ge substrate, a SiGe substrate, a SOI substrate, or a GOI substrate.

In some embodiments, the first wafer 100 is bonded to the second wafer 200 through a bonding layer containing a single dielectric material. The first wafer 100 is provided with a first device 110 and a first interconnect structure 120. The first device 110 is covered by a first covering layer 130 made of a dielectric material. The first interconnect structure 120 is formed in the first covering layer 130. The second wafer 200 is provided with a second device 210 and a second interconnect structure 220. The second device 210 is covered by a second covering layer 230 made of a dielectric material. The second interconnect structure 220 is formed in the second covering layer 230.

In the embodiment, as shown in FIG. 1, the first wafer 100 is further provided with a first bonding layer 150 made of the dielectric material located on the first covering layer 130, and a first alignment pattern 142 located in the first covering layer 130 of a non-device region. The second wafer 200 is provided with a second bonding layer 250 made of the dielectric material located on the second covering layer 230, and a second alignment pattern 242 located in the second covering layer 230 of a non-device region. The first alignment pattern 142 may be formed together with any of wiring layers in the first interconnect structure 120. The second alignment pattern 242 may be formed together with any of wiring layers in the second interconnect structure 220.

In some embodiment, the first wafer 100 is bonded to the second wafer 200 in a hybrid manner. As shown in FIG. 2, the first wafer 100 is provided with a first bonding layer 150 made of a dielectric material located on the first covering layer 130, a first bonding hole 141 in the first bonding layer 150 that is electrically connected with the first interconnect structure 120, and the first alignment pattern 142 located in the first bonding layer 150 of a non-device region. The first bonding hole 141 may be connected with a wiring layer at the top of the first interconnect structure 120 through a connecting hole at the bottom of the first bonding hole 141. The second wafer 200 is provided with a second bonding layer 250 made of a dielectric material located on the second covering layer 230, a second bonding hole 241 in the second bonding layer 250 that is electrically connected with the second interconnect structure 220, and the second alignment pattern 242 located in the second bonding layer 250 of a non-device region. The second bonding hole 241 may be connected with a wiring layer at the top of the second interconnect structure 220 through a connecting hole at the bottom of the second bonding hole 241. In the embodiment, the first alignment pattern 142 may be formed together with any of wiring layers in the first interconnect structure 120 or the first bonding hole. The second alignment pattern 242 may be formed together with any of wiring layers in the second interconnect structure 220 or the second bonding hole.

In the present disclosure, for the convenience of description, a wiring layer being formed together with the first alignment pattern 142 and used for device interconnection is represented as a first wiring layer 141. The first wiring layer 141 may be any of the wiring layers or a bonding hole. A first conductor layer 140 includes the first wiring layer 141 and the first alignment pattern 142 that are located at a same layer. Similarly, a wiring layer being formed together with the second alignment pattern 242 and used for device interconnection is represented as a second wiring layer 241. The second wiring layer 241 may be any of the wiring layers or a bonding hole. A second conductor layer 240 includes the second wiring layer 241 and the second alignment pattern 242 that are located at a same layer. The first wiring layer 141 may be any of the wiring layers in the first interconnect structure 120. In one example, the first interconnect structure 120 includes three layers of wiring layers. The first wiring layer 141 may be a first layer of the wiring layers, a second layer of the wiring layers, or a top layer of the wiring layers. Similarly, the second wiring layer 142 may be any of the wiring layers in the second interconnect structure 220. In a preferred embodiment, as shown in FIG. 1, the first wiring layer 141 and the second wiring layer 241 may be a top layer of the wiring layers. Thus, the first alignment pattern 142 and the second alignment pattern 242 are formed together with the top layer of the wiring layers, so as to improve accuracy of alignment in a subsequent process of bonding. In another example, the first wafer and the second wafer forms a hybrid bonding structure. As shown in FIG. 2, the first wiring layer 141 may be a first bonding hole, and the second wiring layer 241 may be a second bonding hole.

In the above embodiment, the first bonding layer 150 and the second bonding layer 250 are made of a bonding dielectric material, and they may have a single-layer or lamination structure. The first bonding layer 150 and the second bonding layer 250 may be made of a same material or different materials, for example, one or more of the bonding dielectric materials such as silicon oxide, silicon nitride, or Nitrogen doped Silicon Carbide (NDC). In one example, both the first bonding layer 150 and the second bonding layer 250 may be made of silicon oxide. The first bonding hole and the second bonding hole are made of a bonding conductive material such as copper. An insulating layer (not shown in figure) is formed on a side wall of the bonding hole, and the insulating layer is separated from the substrate.

Figure 3:
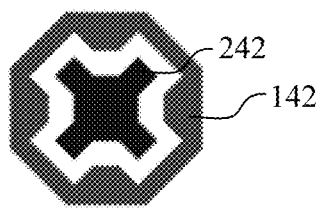
FIG. 3 is a schematic diagram of a picture of a bonding structure for a method for determining expansion compensation in a photoetching process according to an embodiment of the present application, where the picture includes a first alignment pattern and a second alignment pattern.

The first alignment pattern 142 and the second alignment pattern 242 are formed in the non-device region, such as a cutting channel region. The alignment pattern may be used for pattern alignment in a process of photoetching of the wiring layer located at a same layer with the alignment pattern and pattern alignment in a process of bonding, or may be used for pattern alignment in a process of bonding merely. In a specific application, the first alignment pattern 142 is arranged in a suitable non-device region of the first wafer 100, and the second alignment pattern 242 is arranged in a suitable non-device region of the second wafer 200 according to actual requirements. The first alignment pattern 142 and the second alignment pattern 242 may be formed by an appropriate pattern. In some embodiments, the first alignment pattern 142 and the second alignment pattern 242 may be a nested pattern. Referring to FIG. 3, the first alignment pattern 142 and the second alignment pattern 242 are two concentric patterns, with one pattern being surrounded by another pattern. The first alignment pattern 142 and the second alignment pattern 242 may be arranged in corresponding regions of the first wafer 100 and the second wafer 200. The two alignment patterns are in a nested state during bonding, thereby being beneficial to improve accuracy of alignment during a process of bonding the two wafers.

Figure 4:
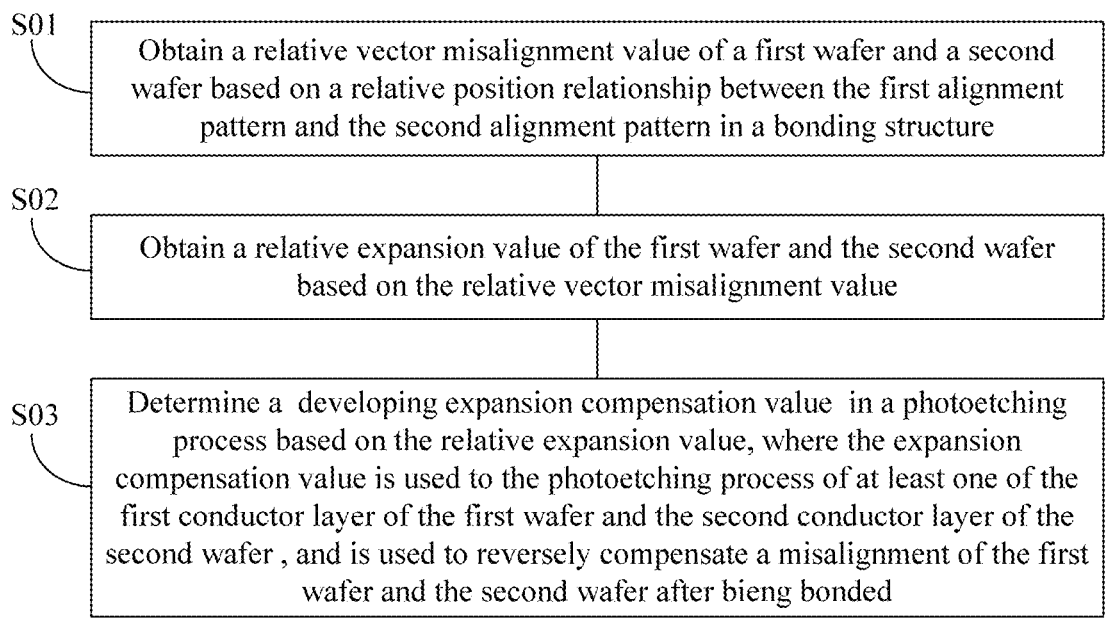
FIG. 4 is a schematic flowchart of a method for determining expansion compensation in a photoetching process according to an embodiment of the present disclosure.

After obtaining the above bonding structure, expansion compensation in a photoetching process is to be determined. Referring to FIG. 4, in step S01, a relative vector misalignment value of the first wafer 100 and the second wafer 200 is obtained based on a relative position relationship between the first alignment pattern 142 and the second alignment pattern 242 in the bonding structure.

After aligning and bonding the two wafers by utilizing the first alignment pattern 142 and the second alignment pattern 242, the first wafer 100 and the second wafer 200 are aligned with each other precisely and are bonded together without misalignment under ideal conditions. If a misalignment exists, a relative vector misalignment value of the first wafer and the second wafer may be obtained based on a relative position relationship between the first alignment pattern 142 and the second alignment pattern 242. In a specific application, the relative vector misalignment value may be obtained based on a difference between an actual relative position of the first alignment pattern 142 and the second alignment pattern 242 and an ideal relative position of the first alignment pattern 142 and the second alignment pattern 242. The misalignment may be a misalignment of the first alignment pattern 142 relative to the second alignment pattern 242, or a misalignment of the second alignment pattern 242 relative to the first alignment pattern 142. The relative vector misalignment value is a vector value. For example, if a misalignment value in a direction is positive, a misalignment value in an opposite direction is negative.

In the embodiment, the relative vector misalignment value may be determined based on a picture of the bonding structure. Firstly, a picture of the bonding structure is obtained. The picture includes the first alignment pattern and the second alignment pattern.

The picture is a top-view picture of the bonding structure captured by an optical device. The picture includes at least the first alignment pattern and the second alignment pattern after being bonded. Thinning is performed on a reverse side of an upper wafer in the bonding structure after bonding, and the picture of the bonding structure is obtained from the thinned upper wafer. The thinned upper wafer has high transparency, thereby being beneficial to capture a clear top-view picture. No thinning may be performed on the upper wafer, and the optical device is applied to take a photo of the bonding structure directly. In some applications, the first alignment pattern and the second alignment pattern are nested, and the first alignment pattern and the second alignment pattern in the picture is a nested pattern after being bonded, as shown in FIG. 3.

Then, central points of the first alignment pattern and the second alignment pattern in the picture are determined. A vector misalignment value of one of the first and second wafers relative to another of the first and second wafers is determined based on the central points.

In the picture, it is easy to determine the central points of the first alignment pattern and the second alignment pattern. Based on a difference between an actual relative position relationship of the two central points and an ideal relative position relationship of the two central points, a misalignment value and a misalignment direction of one central point relative to another central point are determined. Thus, the vector misalignment value of one of the first and second wafers relative to another of the first and second wafers is obtained.

In step S02, a relative expansion value of the first wafer and the second wafer is obtained based on the relative vector misalignment value.

The relative expansion value of the first wafer and the second wafer may be determined based on the relative vector misalignment value. The relative expansion value refers to a parameter value indicating protrusion or retraction of an edge of one of the first and second wafers relative to another of the first and second wafers. The parameter value is a vector. In a specific application, the developing expansion compensation value may be calculated based on the vector misalignment value of the central points by means of an empirical formula. The empirical formula may be created according to a large amount of experimental data combined with influence parameters.

In step S03, a developing expansion compensation value for a photoetching process is determined based on the relative expansion value. The expansion compensation value is used to the photoetching process of the first conductor layer of the first wafer and/or the second conductor layer of the second wafer, and is used to reversely compensate a misalignment of the first wafer and the second wafer after being bonded.

Photoetching is necessary during a process of forming the conductor layer. In some applications, a wiring groove is formed in a dielectric material through a process of photoetching and etching, and then the wiring groove is filled with a conductive material such as copper, to form a conductor layer. In some other applications, the conductive material such as aluminum is deposited firstly, and then a process of photoetching and etching is performed on the conductive material, to form a conductor layer. In the process of photoetching, a pattern in a mask plate is transferred to a photoresist through a series steps of spin-coating photoresist, development, or exposure, etc. In the step of development, an expansion compensation value is set to enlarge or decrease the transferred pattern integrally. A sign of the parameter value is used to represent an enlarged or decreased compensation, while a compensation numerical value is used to represent a degree of the enlargement or decreasing.

The relative expansion value of the wafers is obtained based on the bonding structure. A reverse compensation can be performed in a process of photoetching of the wiring layer located at a same layer with the alignment pattern in a wafer to be bonded subsequently to form a similar bonding structure, based on the relative expansion value and an expansion direction. In this way, when manufacturing a wafer to be bonded, a compensation for the alignment is performed in advance in the process of photoetching. Therefore, in a subsequent process of bonding, the misalignment caused by bonding can be reduced or eliminated due to the compensation performed in advance.

The compensation may be made to the first wafer and/or the second wafer. A developing expansion compensation may be performed in a process of photoetching of the first conductor layer in the first wafer, or may be performed in a process of photoetching of the second conductor layer in the second wafer, or may be performed in both the process of photoetching of the first conductor layer in the first wafer and the process of photoetching of the second conductor layer in the second wafer. An expansion compensation parameter is determined based on the relative vector misalignment value and the wafer to be compensated. The compensation is performed to compensate for the misalignment of the first wafer and the second wafer after being bonded, thereby reducing or eliminating the misalignment.

In an example, the vector misalignment value is a vector value of the misalignment of the first wafer 100 relative to the second wafer 200. If the expansion compensation value for the vector misalignment value is −0.2 angstrom and the expansion compensation value of the first wafer 100 in a process of photoetching is 0.2 angstrom, the misalignment can be eliminated theoretically. For different wafers to be compensated, different compensations are performed to make sure that the expansion compensation value of the first wafer 100 in the process of photoetching is 0.2 angstrom. If the compensation is performed on the first wafer 100 only, the developing expansion compensation value in the process of photoetching of the first conductor layer in the first wafer may be 0.2 angstrom. If the compensation is performed on the second wafer 200 only, the developing expansion compensation value in the process of photoetching of the second conductor layer in the second wafer may be −0.2 angstrom. If the compensation is performed on both the first wafer and the second wafer, the developing expansion compensation value in the process of photoetching of the first conductor layer in the first wafer may be 0.1 angstrom, and the developing expansion compensation value in the process of photoetching of the second conductor layer in the second wafer may be −0.1 angstrom. It should be understood that, the above example is only for illustration. In a specific application, the compensation value may be set based on actual requirements, and a total compensation value may be slightly smaller or greater than, or equal to the expansion compensation value.

In this way, the developing expansion compensation value in the process of photoetching can be determined. During a subsequent process of manufacturing the first wafer and/or the second wafer to be bonded, a device is manufactured based on the developing expansion compensation value in the process of photoetching, thereby forming a first wafer and/or a second wafer subjected to misalignment compensation in advance.

Figure 5:
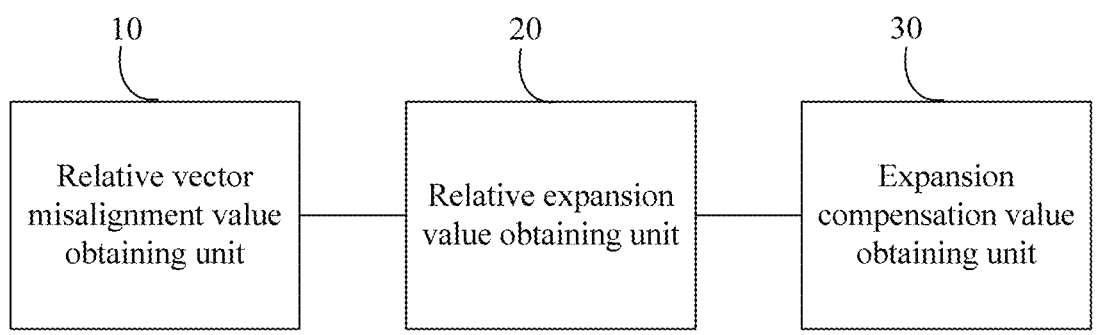
FIG. 5 is a schematic structural diagram of an apparatus for determining expansion compensation in a photoetching process according to an embodiment of the present disclosure.

The method for determining expansion compensation in the photoetching process according to embodiments of the present disclosure is described in detail above. Additionally, an apparatus for determining expansion compensation in a photoetching process is further provided according to the present disclosure. The expansion compensation for the photoetching process is performed based on a bonding structure. The bonding structure includes a first wafer and a second wafer to be bonded. The first wafer is provided with a first conductor layer including a first wiring layer and a first alignment pattern. The second wafer is provided with a second conductor layer including a second wiring layer and a second alignment pattern. The bonding structure is obtained by aligning the first wafer with the second wafer through the first alignment pattern and the second alignment pattern, and bonding the first wafer to the second wafer. As shown in FIG. 5, the apparatus includes: a relative vector misalignment value obtaining unit 10, a relative expansion value obtaining unit 20 and an expansion compensation value obtaining unit 30.

The relative vector misalignment value obtaining unit 10 is configured to obtain a relative vector misalignment value of the first wafer and the second wafer based on a relative position relationship between the first alignment pattern and the second alignment pattern in the bonding structure.

The relative expansion value obtaining unit 20 is configured to obtain a relative expansion value of the first wafer and the second wafer based on the relative vector misalignment value.

The expansion compensation value obtaining unit 30 is configured to determine a developing expansion compensation value in the photo-etching process based on the relative expansion value. The expansion compensation value is used to a photoetching process of the first conductor layer of the first wafer and/or the second conductor layer of the second wafer, and is used to reversely compensate a misalignment of the first wafer and the second wafer after being bonded.

Further, the relative vector misalignment value obtaining unit includes: a picture obtaining unit, a central point determination unit and a vector misalignment value determination unit.

The picture obtaining unit is configured to obtain a picture of the bonding structure. The picture includes the first alignment pattern and the second alignment pattern.

The central point determination unit is configured to determine a central point of the first alignment pattern and the second alignment pattern in the picture.

The vector misalignment value determination unit is configured to obtain the relative vector misalignment value of the first wafer and the second wafer based on the central point. The relative vector misalignment value indicates a vector misalignment value of one of the first wafer and the second wafer relative to another of the first wafer and the second wafer.

Further, the first alignment pattern and the second alignment pattern are matched in a direction perpendicular to the bonding structure, to form a nested pattern.

A method for manufacturing a semiconductor device is further provided according to the present disclosure. The method is applied to form a wafer to be bonded, and includes:

providing a wafer, where the wafer is provided with a covering layer, and a device structure is arranged in the covering layer;

forming a conductor layer on the wafer, where the conductor layer includes a wiring layer and an alignment pattern; and processing the device structure until a wafer for bonding is formed, where a developing expansion compensation is performed in a process of photoetching to form the conductor layer, and a compensation value for the expansion compensation is determined according to the above method for determining expansion compensation in a photo-etching process in the above embodiments.

In a specific application, for different wafers to be compensated, the expansion compensation value may be applied to merely one wafer for bonding, for example, a first wafer 100 or a second wafer 200 as shown in FIG. 1 and FIG. 2 in the embodiment of the present disclosure. Alternatively, the expansion compensation value may be applied to two wafers for bonding, for example, the first wafer 100 and the second wafer 200 in the embodiment of the present disclosure. Therefore, the above method for manufacturing a semiconductor device may be used to form one or two wafers for bonding in a specific application.

After the conductor layer is formed on the wafer, other processes may be performed on the device structure according to different process requirements. In some embodiments, if the wiring layer of the conductor layer is a top metal layer of the device structure, a process of forming a bonding layer and a bonding hole may be performed. In some other embodiments, if the wiring layer of the conductor layer is a bonding hole of the device structure, the wafer for bonding is formed.

After the wafer for bonding is obtained, a process of bonding is performed. As shown in FIG. 1 and FIG. 2, the process of bonding includes:

providing a first wafer 100 and a second wafer 200 to be bonded, where the first wafer 100 is provided with a first conductor layer 140 including a first wiring layer 141 and a first alignment pattern 142; the second wafer 200 is provided with a second conductor layer 240 including a second wiring layer 241 and a second alignment pattern 242, and the first wafer 100 and/or the second wafer 200 is manufactured according to the above method for manufacturing a semiconductor device; and aligning the first wafer 100 with the second wafer 200 through the first alignment pattern 142 and the second alignment pattern 242, and bonding the first wafer 100 to the second wafer 200.

Since a compensation is performed for the misalignment between wafers to be bonded in advance in the process of photoetching, the misalignment of the wafers caused by bonding is eliminated in the process of bonding, thereby reducing the misalignment of the wafers in the process of bonding and improving the yield and performance of products.

The embodiments in this specification are described in a progressive manner. For the same or similar parts between the embodiments, one may refer to the description of other embodiments. Each embodiment lays emphasis on differences from other embodiments. Since the embodiments related to the method for manufacturing an apparatus and a device are similar to the embodiments related to the method for determining expansion compensation in the photoetching process, description of the former embodiments are relatively simple. For related parts, one may be refer to description in the method embodiment.

The above embodiments are preferred embodiments of the present disclosure and are not intended to limit the scope of the present disclosure. It should be understood that, for those skilled in the art, alternations, modifications or equivalent substitutions may be made to the technical solutions of the present disclosure according to the methods and technical solutions above without departing from the scope of the technical solutions of the present disclosure. These alternations, modifications or equivalent substitutions made according to the technical essence of the present disclosure fall within the protection scope of the present disclosure.

The invention claimed is:

1. A method for determining expansion compensation in a photoetching process, wherein expansion compensation on the photoetching process is performed based on a bonding structure; the bonding structure comprises a first wafer and a second wafer to be bonded, the first wafer is provided with a first conductor layer comprising a first wiring layer and a first alignment pattern, the second wafer is provided with a second conductor layer comprising a second wiring layer and a second alignment pattern; the bonding structure is obtained by aligning the first wafer with the second wafer through the first alignment pattern and the second alignment pattern, and bonding the first wafer to the second wafer; and wherein the method comprises:

obtaining a relative vector misalignment value of the first wafer and the second wafer based on a relative position relationship between the first alignment pattern and the second alignment pattern in the bonding structure;

obtaining a relative expansion value of the first wafer and the second wafer based on the relative vector misalignment value; and determining a developing expansion compensation value in the photoetching process based on the relative expansion value, wherein a pattern in a mask plate is transferred to a photoresist and the transferred pattern is enlarged or decreased integrally, the expansion compensation value is used to the photoetching process of at least one of the first conductor layer of the first wafer and the second conductor layer of the second wafer, and is used to reversely compensate a misalignment of the first wafer and the second wafer after being bonded.

2. The method according to claim 1, wherein the obtaining the relative vector misalignment value of the first wafer and the second wafer based on the relative position relationship between the first alignment pattern and the second alignment pattern in the bonding structure comprises:

obtaining a picture of the bonding structure, wherein the picture comprises the first alignment pattern and the second alignment pattern;

determining central points of the first alignment pattern and the second alignment pattern in the picture; and obtaining the relative vector misalignment value of the first wafer and the second wafer based on the central points, wherein the relative vector misalignment value indicates a vector misalignment value of one of the first and second wafers relative to another of the first and second wafers.

3. The method according to claim 2, wherein the first alignment pattern and the second alignment pattern are matched in a direction perpendicular to the bonding structure, to form a nested pattern.

4. The method according to claim 1, wherein the first conductor layer is a top metal layer, a first bonding layer made of a dielectric material is provided to cover the first conductor layer; or, the first conductor layer is a bonding hole, and a first bonding layer made of a dielectric material is provided to cover the first conductor layer, wherein the bonding hole is arranged in the first bonding layer.

5. The method according to claim 1, wherein the second conductor layer is a top metal layer, a second bonding layer made of a dielectric material is provided to cover the second conductor layer; or, the second conductor layer is a bonding hole, and a second bonding layer made of a dielectric material is provided to cover the second conductor layer, wherein the bonding hole is arranged in the second bonding layer.

6. An apparatus for determining expansion compensation in a photoetching process, wherein expansion compensation on the photoetching process is performed based on a bonding structure; the bonding structure comprises a first wafer and a second wafer to be bonded, the first wafer is provided with a first conductor layer comprising a first wiring layer and a first alignment pattern, the second wafer is provided with a second conductor layer comprising a second wiring layer and a second alignment pattern; the bonding structure is obtained by aligning the first wafer with the second wafer through the first alignment pattern and the second alignment pattern, and bonding the first wafer to the second wafer; and wherein the apparatus comprises:

a relative vector misalignment value obtaining unit, configured to obtain a relative vector misalignment value of the first wafer and the second wafer based on a relative position relationship between the first alignment pattern and the second alignment pattern in the bonding structure;

a relative expansion value obtaining unit, configured to obtain a relative expansion value of the first wafer and the second wafer based on the relative vector misalignment value; and an expansion compensation value obtaining unit, configured to determine a developing expansion compensation value in the photoetching process based on the relative expansion value, wherein a pattern in a mask plate is transferred to a photoresist and the transferred pattern is enlarged or decreased integrally, the expansion compensation value is used to the photoetching process of at least one of the first conductor layer of the first wafer and the second conductor layer of the second wafer, and is used to reversely compensate a misalignment of the first wafer and the second wafer after being bonded.

7. The apparatus according to claim 6, wherein the relative vector misalignment value obtaining unit comprises:

a picture obtaining unit, configured to obtain a picture of the bonding structure, wherein the picture comprises the first alignment pattern and the second alignment pattern;

a central point determination unit, configured to determine central points of the first alignment pattern and the second alignment pattern in the picture; and a vector misalignment value determination unit, configured to obtain the relative vector misalignment value of the first wafer and the second wafer based on the central points, wherein the relative vector misalignment value indicates a vector misalignment value of one of the first and second wafers relative to another of the first and second wafers.

8. The apparatus according to claim 7, wherein the first alignment pattern and the second alignment pattern are matched in a direction perpendicular to the bonding structure, to form a nested pattern.

9. A method for manufacturing a semiconductor device, applied to form a wafer to be bonded, comprising:

providing a wafer, wherein the wafer is provided with a covering layer, and a device structure is arranged in the covering layer; and forming a conductor layer on the wafer, wherein the conductor layer comprises a wiring layer and an alignment pattern, wherein a developing expansion compensation is performed in the photoetching process to form the conductor layer, and a compensation value for the expansion compensation is determined by the method according to claim 1.

10. A method for manufacturing a semiconductor device, comprising:

providing a first wafer and a second wafer to be bonded, wherein the first wafer is provided with a first conductor layer comprising a first wiring layer and a first alignment pattern, the second wafer is provided with a second conductor layer comprising a second wiring layer and a second alignment pattern; wherein at least one of the first wafer and the second wafer is manufactured by the method according to claim 9; and aligning the first wafer with the second wafer through the first alignment pattern and the second alignment pattern, and bonding the first wafer to the second wafer.

* * * * *